United States Patent
Hamada et al.

(10) Patent No.: US 11,094,905 B2
(45) Date of Patent: Aug. 17, 2021

(54) ORGANIC LIGHT-EMITTING DISPLAY PANEL AND ELECTRONIC DEVICE THEREOF

(71) Applicants: Shanghai Tianma AM-OLED Co., Ltd., Shanghai (CN); Tianma Micro-Electronics Co., Ltd., Shenzhen (CN)

(72) Inventors: Yuji Hamada, Shanghai (CN); Shuang Cheng, Shanghai (CN); Xiangcheng Wang, Shanghai (CN); Jinghua Niu, Shanghai (CN); Zhihong Lei, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 701 days.

(21) Appl. No.: 15/492,072

(22) Filed: Apr. 20, 2017

(65) Prior Publication Data

US 2017/0222171 A1 Aug. 3, 2017

(30) Foreign Application Priority Data

Dec. 29, 2016 (CN) .................. 201611241902.X

(51) Int. Cl.
*H01L 51/50* (2006.01)
*H01L 51/52* (2006.01)
*H01L 27/32* (2006.01)

(52) U.S. Cl.
CPC ...... *H01L 51/5016* (2013.01); *H01L 27/3206* (2013.01); *H01L 51/5265* (2013.01); *H01L 2251/5384* (2013.01)

(58) Field of Classification Search
None
See application file for complete search history.

(56) References Cited

U.S. PATENT DOCUMENTS

2014/0124766 A1* 5/2014 Song .................. H01L 51/5004
257/40
2016/0164004 A1 6/2016 Seo et al.

FOREIGN PATENT DOCUMENTS

| CN | 101669226 A | 3/2010 |
|---|---|---|
| CN | 103762317 A | 4/2014 |
| CN | 104882555 A | 9/2015 |
| CN | 104900815 A | 9/2015 |

(Continued)

*Primary Examiner* — Jay Yang
(74) *Attorney, Agent, or Firm* — Anova Law Group, PLLC

(57) ABSTRACT

An organic light-emitting display panel and an electronic device thereof are provided. The organic light-emitting display panel comprises a substrate, and a first electrode, a first light-emitting material layer, a second light-emitting material layer, and a second electrode disposed above the substrate in a preset order. The first light-emitting material layer includes at least one P-type host material and at least one N-type host, material, and a total volume percentage content of the P-type host material is more than a total volume percentage content of the N-type host material. The second light-emitting material layer includes at least one P-type host material and at least one N-type host material, and a total volume percentage content of the N-type host material is more than a total volume percentage content of the P-type host material.

20 Claims, 2 Drawing Sheets

(56) References Cited

FOREIGN PATENT DOCUMENTS

CN 103811531 B 11/2016
TW 200731592 A 8/2007

* cited by examiner

ORGANIC LIGHT-EMITTING DISPLAY PANEL AND ELECTRONIC DEVICE THEREOF

CROSS-REFERENCES TO RELATED APPLICATIONS

This application claims priority of Chinese Patent Application No. 201611241902.X, filed on Dec. 29, 2016, the entire contents of which are hereby incorporated by reference.

FIELD OF THE DISCLOSURE

The present disclosure generally relates to the field of display technology and, more particularly, relates to an organic light-emitting display panel and an electronic device.

BACKGROUND

An organic light-emitting diode (OLED), also called an organic electroluminescent device, is a phenomenon that when driven by an electric field, the light-emitting material emits light via injection and recombination of carriers. Different from liquid crystal display (LCD) devices, the organic light-emitting display devices are lighter, thinner, and have better viewing angles and contrast, etc., thereby attracting people's wide attention.

The structure of the organic electroluminescent device often includes an anode, an auxiliary functional layer (e.g., a hole transport layer, an electron transport layer, an electron injection layer, etc.), a light-emitting layer, and a cathode that correspond to each pixel region. When voltages are applied to the anode and the cathode, holes and electrons are transported and moved to the light-emitting layer, respectively. Further, the holes and the electrons are recombined in the light-emitting layer to generate excitons. The excitons migrate under the effect of the electric field, transfer the energy to the light-emitting material, and excite electrons in the light-emitting material to transit from a ground state to an excited state. Via radiation, the excited state deactivates to generate photon, thus emitting light.

In existing organic electroluminescent devices, holes and electrons often traverse the light-emitting, layer and are transported to the cathode and the anode, respectively. Because the energies of such holes and electrons are unable to excite a material to emit light, the efficiency and service life of the devices are reduced. Meanwhile, after being recombined to form excitons, the holes and the electrons may diffuse towards two sides. A part of the exitrons may diffuse to other regions undoped with a light-emitting material, such as the hole transport layer or the electron transport layer, etc., and then be attenuated.

However, according to the present disclosure, the attenuation of such exitrons cannot produce photons, resulting in reduction in the light-emitting efficiency of the organic electroluminescent devices. Further, the position of the light-emitting center in the light-emitting layer of the existing organic electroluminescent devices often shifts easily. By simulation, the shift of the position of the light-emitting center is found to create issues of variance in the light-emitting brightness and the color bias of the display panel.

The disclosed organic light-emitting display panel and electronic device thereof are directed to solving at least partial problems set forth above and other problems.

BRIEF SUMMARY OF THE DISCLOSURE

One aspect of the present disclosure provides an organic light-emitting display panel. The organic light-emitting display panel comprises a substrate, and a first electrode, a first light-emitting material layer, a second light-emitting material layer, and a second electrode disposed above the substrate in a preset order. The first light-emitting material layer includes at least one P-type host material and at least one N-type host material, and a total volume percentage content of the P-type host material is more than a total volume percentage content of the N-type host material. The second light-emitting material layer includes at least one P-type host material, and at least one N-type host material, and a total volume percentage content of the N-type host material is more than a total volume percentage content of the P-type host material.

Another aspect of the present disclosure provides an electronic device including an organic light-emitting display panel. The organic light-emitting display panel comprises a substrate, and a first electrode, a first light-emitting material layer, a second light-emitting material layer, and a second electrode disposed above the substrate in a preset order. The first light-emitting material layer includes at least one P-type host material and at least one N-type host material, and a total volume percentage content of the P-type host material is more than a total volume percentage content of the N-type host material. The second light-emitting material layer includes at least one P-type host material and at least one N-type host material, and a total volume percentage content of the N-type host material is more than a total volume percentage content of the P-type host material.

Other aspects of the present disclosure can be understood by those skilled in the art in light of the description, the claims, and the drawings of the present disclosure.

BRIEF DESCRIPTION OP THE DRAWINGS

Other features, goals, and advantages of the present disclosure will become more apparent via a reading of detailed descriptions of non-limiting embodiments with reference to the accompanying drawings.

DETAILED DESCRIPTION

Reference will be made in detail with reference to embodiments of the present disclosure as illustrated in the accompanying drawings and embodiments. It should be understood that, specific embodiments described herein are only for illustrative purposes, and are not intended to limit the scope of the present disclosure. In addition, for case of description, accompanying drawings only illustrate apart of, but not entire structure related to the present disclosure.

As discussed above, in organic electroluminescent devices, holes and electrons often traverse the light-emitting layer and are transported to the anode and cathode, respectively. The energies of such holes and electrons are unable to excite light emission, thereby reducing the efficiency and service life of the devices. Further, a part of exitons formed in the light-emitting layer may diffuse to other regions undoped with a light-emitting material. The attenuation of such exitons cannot generate photons, resulting in the reduction in the light-emitting efficiency of the devices. Further, the position of the light-emitting center in the light-emitting layer shifts easily, rendering variance in the light-emitting brightness and color bias of a display panel.

Directed to solving at least partial problems set forth above and other problems, the present disclosure provides an improved organic light-emitting display panel. According to the present disclosure, the organic light-emitting display panel includes at least a first electrode, a first light-emitting material layer, a second light-emitting material layer, and a second electrode. The first and the second light-emitting material layers both include at least one P-type host material and at least one N-type host material, thereby providing functions of transporting both elections and holes.

By configuring two light-emitting material layers in the organic light-emitting display panel, the holes and the electrons may be effectively balanced in the host material of the light-emitting layers. Further, the configuration of two light-emitting material layers may control the position and size of the light-emitting center (also called light-emitting site) at an interface between the first and the second light-emitting material layers. Accordingly, the recombination region of the electrons and the holes is restricted inside the two light-emitting material layers, thereby improving the light-emitting efficiency and service life of devices.

Figure 1:
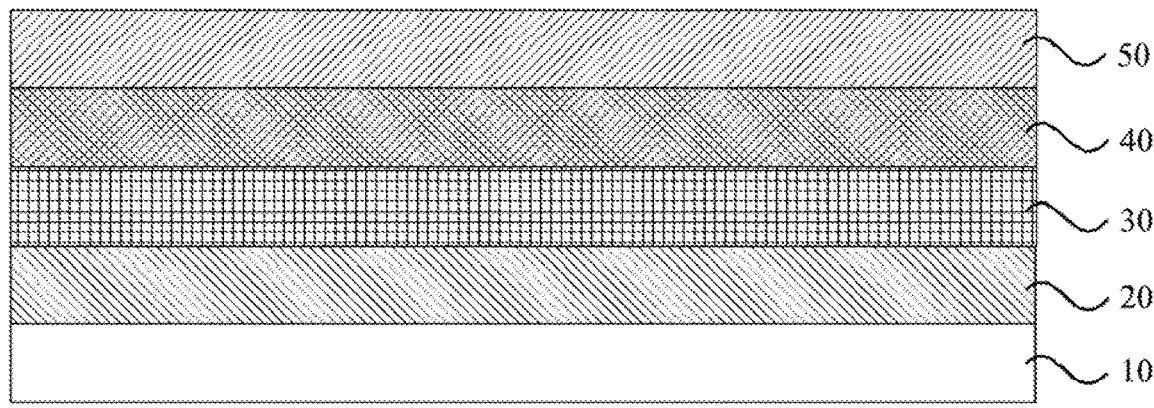
FIG. 1 illustrates a structural schematic view of an exemplary organic light-emitting display panel according to embodiments of the present disclosure.

FIG. 1 illustrates a structural schematic view of an exemplary organic light-emitting display panel according to embodiments of the present disclosure. As shown in FIG. 1, an organic light-emitting display panel may include a substrate 10, as well as a first electrode 20, a first light-emitting material layer 30, a second light-emitting material layer 40, and a second electrode 50 disposed sequentially above the substrate 10.

In particular, the first light-emitting material layer 30 may include at least one P-type host material and at least one N-type host material. The second light-emitting material layer 40 may include at least one P-type host material and at least one N-type host material. Further, in the first light-emitting material layer 30, the total volume percentage content (% by volume) of the P-type host material may be greater than the total volume percentage content of the N-type host material in the second light-emitting material layer 40, the total volume percentage content (% by volume) of the N-type host material may be greater than the total volume percentage content of the P-type host material.

Because in the first light-emitting material layer 30, the total volume percentage content of the P-type host material is greater than the total volume percentage content of the N-type host material the first light-emitting layer 30 may have a hole transporting ability. Because in the second light-emitting material layer 40, the total volume percentage content of the N-type host material is greater than the total volume percentage content of the P-type host material, the second light-emitting layer 40 may have an electron transporting ability.

After an electric field is generated between the first electrode 20 and the second electrode 50 of the organic light-emitting display panel, the electrons may be transported from the first electrode 20 to the first light-emitting material layer 30, and the holes may be transported from the second electrode 50 to the second light-emitting material layer 40. Because the first and the second light-emitting material layers have different carrier transporting abilities and are able to transport holes and electrons, respectively, exitons generated by recombination of the electrons and the holes may mostly occur near the interface between the first and second light-emitting material layers.

The first light-emitting material layer may reduce the accumulation of the holes in the first light-emitting material layer, and the second light-emitting material layer may reduce the accumulation of the electrons in the second light-emitting material layer. Accordingly, the recombination region of the electrons and the holes may be restricted in a central position of the light-emitting layers (i.e., near the interface between the first and the second light-emitting material layers).

By accurately controlling the position and size of the light-emitting center (i.e., the recombination region of the electrons and the holes), the brightness variance and the color-bias phenomenon caused by shift of the light-emitting center of the devices along with the applied current may be avoided, further, the exitons generated by recombination of the electrons and the holes may be more fully utilized, thereby improving the efficiency of the devices.

Optionally, in the first light-emitting material layer 30, the ratio of the total volume percentage content of the P-type host material to the total volume percentage content of the N-type host material may be configured, within a range of approximately [1,9], thereby improving the host transporting ability of the first light-emitting material layer 30. Optionally, in material in the second light-emitting material layer 40, the ratio of the total volume percentage content of the P-type host to the total volume percentage content of the N-type host material may be configured within a range of approximately [1/9, 1], thereby improving the electron transporting ability of the second light-emitting material layer 40.

By adjusting the content ratio of the P-type host material and the N-type host material in each light-emitting material layer, the sixe of the recombination region of the electrons and the holes may be effectively controlled. Because the total volume percentage content of the P-type host material in the first light-emitting material layer 30 is high and the total volume percentage content of the N-type host material in the second light-emitting material layer 40 is high, the two carriers (i.e., electrons and holes) may not easily diffuse to the corresponding oppositely disposed light-emitting material layer. Accordingly, the two carriers may be mostly recombined near the interface between the first and the second light-emitting material layers, thereby improving the efficiency and service life of the devices.

Based on the aforementioned embodiments, optionally, the P-type host material in the first light-emitting material layer 30 may be the same as or different from the P-type host material in the second light-emitting material layer 40. Optionally, the N-type host material in the first light-emitting material layer 30 may be the same as or different from the N-type host material in the second light-emitting material layer 40. For example, in one embodiment the P-type host material in the first, light-emitting material layer 30 may be the same as the P-type host material in the second light-emitting material, layer 40, and the N-type host material in the first light-emitting material layer 30 may be the same as the N-type host material in the second, light-emitting material layer 40.

In some other embodiments, the P-type host material in the first light-emitting material layer 30 may be the same as the P-type host material in the second light-emitting material layer 40, and the N-type host material in the first light-emitting material layer 30 may be different from the N-type host material in the second light-emitting material layer 40. The present disclosure is not limited thereto.

By adjusting the content ratio of the two host materials in different types (e.g., the content ratio of the P-type host material to the N-type host material) in the same light-emitting material layer, the light-emitting material layers of different carrier transporting types may be implemented. Optionally, the P-type host material in the first light-emitting material layer 30 and/or the P-type host material in the second Sight-emitting material layer 40 may include a carbazole-type group. Optionally, the N-type host material in the first light-emitting material layer 30 and/or the N-type host material in the second light-emitting material layer 40 may include an aromatic ring group.

Further, the first light-emitting material layer 30 may further include at least one guest dopant, and the second light-emitting material layer 40 may further include at least one guest dopant. The guest dopant in the first light-emitting material layer 30 may be the same as or different from the guest dopant in the second light-emitting material 40. Optionally, the guest dopant in the first light-emitting material layer 30 may be a single dopant, a pre-mixed dopant, or a co-dopant. Optionally, the guest dopant in the second light-emitting material layer 40 may be a single dopant, a pre-mixed dopant, or a co-dopant.

Further, in OLEDs, the guest dopant in the first light-emitting material layer 30 and the guest dopant in the second light-emitting material layer 40 may each be a fluorescent material. Further, in phosphorescent organic light-emitting diodes (PHOLEDs), the guest dopant in the first light-emitting material layer 30 and the guest dopant in the second light-emitting material layer 40 may each be a phosphorescent material. Detailed descriptions may be provided hereinafter.

The excited states of organic molecules may include a singlet state and a triplet state, and calculation based on spin statistics indicates that the probability of forming singlet state and triplet state exitons may be 25% and 75%, respectively. Accordingly, the internal quantum efficiency of the OLED based on fluorescent material may have an upper limit of approximately 25%. Different from the existing OLEDs with light-emitting modules made of a fluorescent material the phosphorescent organic light-emitting diodes (PHOLEDs) based on phosphorescent material may utilize the singlet state and triplet state exitons simultaneously. Thus, the internal quantum efficiency of PHOLEDs may have an upper limit of approximately 99.99%.

Accordingly, in one embodiment, the first light-emitting material layer 30 may be configured to include at least one guest phosphorescent material, and the second light-emitting material layer may be configured to include at least one guest phosphorescent material. One major issue exists in the phosphorescent material based devices may be the quenching of the triplet state exitons under a high current density, which renders rapid attenuation of the light-emitting efficiency under the high current density.

By disposing the first light-emitting material layer and the second light-emitting material layer in an organic light-emitting display panel, the present disclosure may reduce the accumulation of the carriers, thereby reducing the triplet-triplet exiton annihilation. Further, the deterioration of the devices caused by electric charge accumulation may also be alleviated, thereby improving the efficiency and service life of the devices.

Those skilled in the art should understand that, in the light-emitting material layers, the content of the host material may be greater than the content of the guest dopant (e.g., the guest phosphorescent material). Often, the absolute value of the HOMO energy level of she host material |T host (HOMO)| may be greater than the absolute value of the HOMO energy level of the guest dopant |T dopant (HOMO)|. Further, the absolute value of the LUMO energy level of the host material |T host (LUMO)| may be smaller than the absolute value of the LUMO energy level of the guest dopant |T dopant (LUMO)|.

Further, the triplet state energy level of the host material T host (S) may be greater than the triplet state energy level of the guest dopant T dopant (S). The triplet state exiton energy of the host material may be effectively transferred to the guest dopant, and the emission spectrum of the host material and the absorption spectrum of the guest dopant may be matched regarding the energy.

Based on aforementioned descriptions, optionally, the total volume percentage content of the guest phosphorescent material in the first light-emitting material layer 30 may be configured to be greater than the total volume percentage content of the guest phosphorescent material in the second light-emitting material layer 40. Because the guest phosphorescent material facilitates the hole transport but not the electron transport, if a relatively high concentration of guest phosphorescent material exists in the second light-emitting material layer 40, the injection of the electrons may be hindered.

Accordingly, the total volume percentage content of the guest phosphorescent material in the first light-emitting material layer 30 may be configured to be higher than the total volume percentage content of the guest phosphorescent material in the second light-emitting material layer 40. Thus, the injection between the electric charges and the holes may be balanced, and the efficiency and service life of the devices may be improved.

Optionally, the total volume percentage content of the guest phosphorescent material in the first light-emitting material layer 30 may be configured to be greater than or equal to 3% and smaller than or equal to 10%. Optionally, the total volume percentage content of the guest phosphorescent material in the second light-emitting material layer 40 may be configured to be greater than or equal to 0.5% and smaller than or equal to 3%. By properly reducing the total volume percentage content of the guest phosphorescent material in the second light-emitting material layer 40, the hindering effect of the second light-emitting material layer 40 towards the elections may be reduced, the driving voltage of the devices may be decreased, and the efficiency of the devices may be improved.

Optionally, the guest phosphorescent material in the first light-emitting material layer 30 may be the same as the guest phosphorescent material in the second light-emitting material layer 40. The guest phosphorescent material in the first light-emitting material layer 30 and/or the guest phosphorescent material in the second fight-emitting material layer 40 may include coordination compounds comprising an element of Ir, Pt, or Cu.

Optionally, the thickness of the first light-emitting material layer 30 may be greater than the thickness of the second light-emitting material layer 40. For example, the ratio of the thickness of the first light-emitting material layer 30 to the thickness of the second light-emitting material layer 40 may be configured to be greater than or equal to 1 and smaller than or equal to 2. Because the total volume percentage content of the guest phosphorescent material in the first light-emitting layer 30 is relatively large, the configuration of a relatively thick first light-emitting material layer may avoid the triplet state exitons generated in the first light-emitting material, layer being restricted in a narrow region. Accordingly, the triplet-triplet exiton annihilation phenomenon induced by an excess concentration of local triplet state exitons may be avoided.

Further, because the total volume percentage content of the guest phosphorescent material in the first light-emitting material layer 30 is higher than the total volume percentage content of the guest phosphorescent material in the second light-emitting material layer 40, if the first light-emitting material layer 30 is too thin, the doping effect of the first light-emitting material layer 30 may be easily affected by other film layers. For example, the impurity ions in other film layers may diffuse into the first light-emitting material layer 30, thereby forming a large number of exiton quenching centers.

Or, for example, the guest phosphorescent material in the first light-emitting material layer 30 may diffuse into other film layers, thereby forming a large amount of exiton quenching centers. Accordingly, the disclosed thickness configuration of the first light-emitting material layer 30 and the second light-emitting material layer 40 may further prevent other film layers from affecting the doping effect of the first light-emitting material layer, thereby improving the efficiency and service life of the devices.

Further, if the thickness of the first light-emitting material layer 30 is configured to be smaller than or equal to the thickness of the second light-emitting material layer 40, the content of the guest phosphorescent material in the first light-emitting material layer 30 may be higher than the content of the guest phosphorescent material in the second light-emitting material layer 40. Accordingly, given that the second light-emitting material layer 40 is properly designed, situations where impurities in other layers diffuse into the first light-emitting material layer 30 or the guest phosphorescent material easily diffuse out of the first light-emitting material layer 30 may easily occur. Such situations not only affect the light-emitting efficiency of the organic light-emitting display panels, but also affect the service life of the organic light-emitting display panels.

Further, the electrons and the holes may be recombined in the light-emitting material layers to generate exitons. The exitons may transfer the energy to the guest material and emit light by relaxation. Because a high concentration guest doping may result in concentration annihilation, the exitons may not be emitted as light, thereby reducing the light-emitting efficiency of the organic light-emitting display panel. Accordingly, the first light-emitting material layer with a relatively high guest content may need to have a relatively larger thickness.

Figure 2:
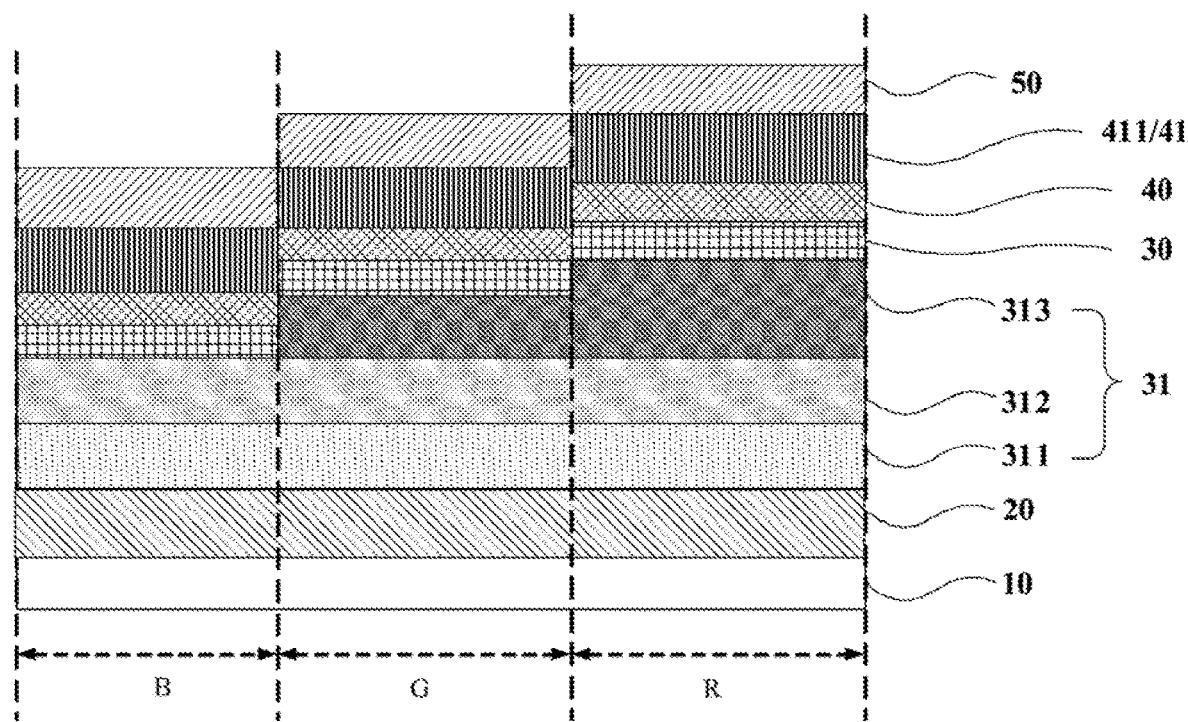
FIG. 2 illustrates a structural schematic view of another exemplary organic light-emitting display panel according to embodiments of the present disclosure.

FIG. 2 illustrates a structural schematic view of another exemplary organic light-emitting display panel according to embodiments of the present disclosure. As shown in FIG. 2, in one embodiment, the organic light-emitting display panel may include a substrate 10, a first electrode 20, a first light-emitting material layer 30, a second light-emitting material laser 40, and a second electrode 50.

Further, a first auxiliary functional layer 31 may be sandwiched between the first electrode 20 and the first light-emitting material layer 30. A second auxiliary functional layer 41 may be sandwiched between the second electrode 50 and the second light-emitting material layer 40. The first auxiliary functional layer 31, the first light-emitting material layer 30, the second light-emitting material layer 40, and the second auxiliary functional layer 41 may be formed via an evaporation method.

The first auxiliary functional layer 31 may be a hole-type or P-type auxiliary functional layer, and may have a multi-layer structure including one or more of an hole injection layer, a hole transport layer, and an electron barrier layer. As shown in FIG. 2, the first auxiliary functional layer 31 may be configured to include a hole injection layer 311 and a hole transport layer 312. Optionally, the first auxiliary functional layer 31 may further include a hole transport assisting layer 313.

Further, the second auxiliary functional layer 41 may be an N-type auxiliary functional layer, and may also have a multi-layer structure including one or more layers of an electron transport layer, an electron injection layer, and a hole harrier layer. As shown in FIG. 2, in one embodiment, the second auxiliary functional layer 41 may include an electron transport layer 411 for illustrative purposes.

The configuration of the first auxiliary functional layer 31 may, on one hand, allow the holes to be injected from the first electrode 20 into the first light-emitting material layer 30 more easily. On the other hand, the holes injected from the second electrode 50 into the second light-emitting material, layer 40 may be prevented from migrating towards the first electrode 20 after traversing the first light-emitting material layer 30. Accordingly, the holes and the electrons may be recombined inside the light-emitting material layers, thereby further improving the light-emitting efficiency of the organic light-emitting display panel.

Similarly, the configuration of the second auxiliary functional layer 41 may, on one hand, allow the electrons injected from the second electrode. 50 into the second light-emitting material layer 40 more easily. On the other hand, the electrons injected from the first electrons 20 into the first light-emitting material layer 30 may be prevented from migrating towards the second electrode 50 after traversing the second light-emitting material layer 40. Accordingly, the holes and the electrons may be recombined inside the light-emitting material layers, and the light-emitting efficiency of the organic light-emitting display panel may be further improved.

In one embodiment, the first electrode 20 may at least further include a reflective electrode layer (not shown). The reflective electrode layer may be configured to enhance reflectivity, and improve the light utilization efficiency of the organic light-emitting display panel. More specifically, in one embodiment, the first electrode 20 may include, for example, an indium tin oxide (ITO) conducting film, a reflective electrode layer (Ag), and another ITO conducting film disposed in a preset order or sequentially. The ITO conducting film is a material with a high work function, thus facilitating the injection of holes.

Further, a microcavity structure may be formed between the first electrode 20 and the second electrode 50. The microcavity structure may utilize effects such, as reflection, all reflection, interference, diffraction, and scattering, etc. of light at interfaces with discontinuous reflectivity to restrict the light in a small wavelength region. By adjusting the cavity length and the thickness of each layer inside the microcavity structure, the light-emitting center may be located near enhancement peak of a standing wave field inside the microcavity structure. Accordingly, the coupling efficiency between the radiating dipole of the organic light-emitting display panel and the electric filed inside the microcavity structure may be enhanced, thereby improving the light-emitting efficiency and the brightness of the organic light-emitting display panel.

In one embodiment, the organic light-emitting display panel may include a plurality of light-emitting units. For example, FIG. 2 illustrates a light-emitting unit R of a red light-emitting color, a light-emitting unit G of a green light-emitting color, and a light-emitting unit B of a blue light-emitting color for illustrative purposes. Because light in different colors has different wavelengths, different effective cavity lengths may need to be configured for microcavity structures corresponding to different pixel regions of different light-emitting colors. The effective cavity length of the microcavity structure may refer to the length of an optical path of the light in the microcavity structure.

Via the first auxiliary functional layer 31, the first light-emitting material layer 30, the second light-emitting material layer 40, and the second auxiliary functional layer 41, the effective cavity length of the microcaivity structure may be adjusted. For example, FIG. 2 illustrates a situation where the effective cavity length of the microcavity structure is adjusted via the first auxiliary functional layer 31 for illustrative purposes. The specific layer included in the first auxiliary functional layer 31 that adjusts the effective cavity length of the microcavity structure may be called a hole transport auxiliary layer 313.

More specifically, referring to FIG. 2, the hole transport auxiliary layer 313 may be disposed above the hole transport layer 312 of the light-emitting unit R of a red light-emitting color and the hole transport layer 312 of the light-emitting unit G of a green light-emitting color. Further, the thickness of the hole transport auxiliary layer 313 corresponding to the light-emitting unit R of the red light-emitting color may be greater than the thickness of the hole transport auxiliary layer 313 corresponding to the light-emitting unit G of the green light-emitting color.

Based on the aforementioned embodiments, optionally, the difference in the light-emitting wavelength between the first light-emitting material layer 30 and the second light-emitting material layer 40 may be smaller than or equal to 30 nm. If the first light-emitting material layer 30 and the second light-emitting material layer 40 are in the same light-emitting unit (e.g., light-emitting unit R, G, or B), the first light-emitting material layer 30 and the second light-emitting material layer 40 may be configured to emit light of the same wavelength.

When the difference in the light-emitting wavelength between the first light-emitting material layer 30 and the second light-emitting material layer 40 is smaller than or equal to 30 nm, given that the holes and the electrons are effectively balanced in the light-emitting material layers, the color stability and the color purity of the organic light-emitting display panel may be guaranteed.

Figure 3:
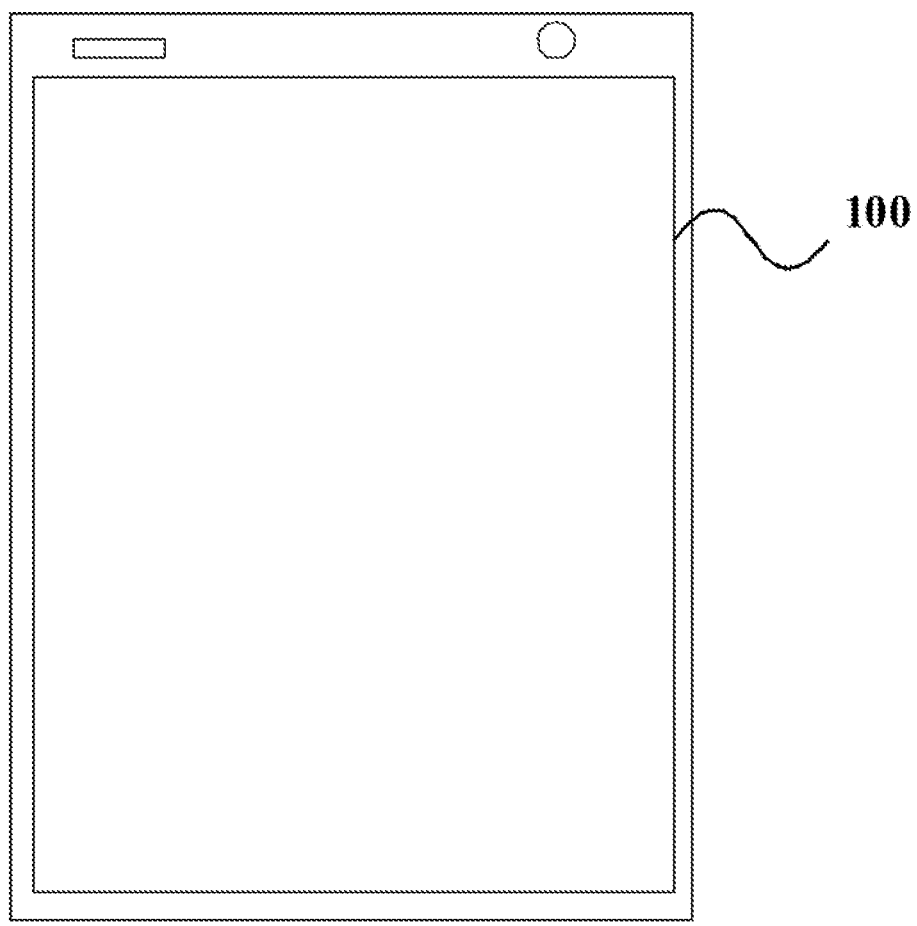
FIG. 3 illustrates a structural schematic view of an exemplary electronic device according to embodiments of the present disclosure.

The present disclosure also provides an electronic device. FIG. 3 illustrates a structural schematic view of an exemplary electronic device according to embodiments of the present disclosure. As shown in FIG. 3, the disclosed electronic device may include an organic light-emitting display panel 100 described in any aforementioned embodiment. The electronic device may be, for example, a cell phone (shown in FIG). 3, or a computer, a TV station, an intelligent wearable device, etc. The present disclosure is not limited thereto.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure, is defined by the appended claims.

What is claimed is:

1. An organic light-emitting display panel, comprising:
a substrate; and
a first electrode, a hole injection layer, a hole transport layer, a hole transport auxiliary layer, a first light-emitting material layer, a second light-emitting material layer, and a second electrode disposed above the substrate in a preset order, such that the hole transport auxiliary layer is between the hole transport layer and the first light-emitting material layer, wherein:
the first light-emitting material layer includes at least one P-type host material and at least one N-type host material, and a total volume percentage content of the P-type host material is greater than a total volume percentage content of the N-type host material,
the second light-emitting material layer includes at least one P-type host material and at least one N-type host material, and a total volume percentage content of the N-type host material is greater than a total volume percentage content of the P-type host material,
the organic light-emitting display panel includes a plurality of light-emitting units corresponding to a red light-emitting color, a green light-emitting color, and a blue light-emitting color, respectively, and
the hole injection layer, the hole transport layer, and the hole transport auxiliary layer together have a non-uniform total thickness,
the non-uniform total thickness including:
a first total thickness corresponding to the blue light-emitting color,
a second total thickness corresponding to the green light-emitting color,
a third total thickness corresponding to the red light-emitting color, and
the first total thickness is less than the second total thickness, and the second total thickness is less than the third total thickness, such that an effective cavity length of a microcavity structure between the first electrode and the second electrode is adjusted according to a light-emitting wavelength in each of the plurality of light-emitting units.

2. The organic light-emitting display panel according to claim 1, wherein:
the first light-emitting material layer further includes at least one guest phosphorescent material,
the second light-emitting material layer further includes at least one guest phosphorescent material, and
a total volume percentage content of the guest phosphorescent material in the first light-emitting material layer is greater than a total volume percentage content of the guest phosphorescent material in the second light-emitting material layer.

3. The organic light-emitting display panel according to claim 2, wherein:
the guest phosphorescent material in the first light-emitting material layer is the same as the guest phosphorescent material in the second light-emitting material layer.

4. The organic light-emitting display panel according to claim 2, wherein:
the total volume percentage content of the guest phosphorescent material in the first light-emitting material layer is greater than or equal to approximately 3%, and smaller than or equal to approximately 10%.

5. The organic light-emitting display panel according to claim 2, wherein:
the total volume percentage content of the guest phosphorescent material in the second light-emitting material layer is greater than or equal to approximately 0.5%, and smaller than or equal to approximately 3%.

6. The organic light-emitting display panel according to claim 2, wherein:
at least one of the guest phosphorescent material in the first light-emitting material layer and the guest phosphorescent material in the second light-emitting material layer includes a coordinate compound, the coordinate compound comprising Ir.

7. The organic light-emitting display panel according to claim 1, wherein:
the P-type host material in the first light-emitting material layer is the same as the P-type host material in the second light-emitting material layer, and
the N-type host material in the first light-emitting material layer is the same as the N-type host material in the second light-emitting material layer.

8. The organic light-emitting display panel according to claim 1, wherein:
a thickness of the first light-emitting material layer is greater than a thickness of the second light-emitting material layer.

9. The organic light-emitting display panel according to claim 1, wherein:
a thickness ratio of the first light-emitting material layer to the second light-emitting material layer is greater than or equal to approximately 1, and smaller than or equal to approximately 2.

10. The organic light-emitting display panel according to claim 1, wherein:
in the first light-emitting material layer, a ratio of the total volume percentage content of the P-type host material to the total volume percentage content of the N-type host material is in a range of approximately [1, 9].

11. The organic light-emitting display panel according to claim 1, wherein:
in the second light-emitting material layer, a ratio of the total volume percentage content of the P-type host material to the total volume percentage content of the N-type host material is in a range of approximately [1/9, 1].

12. The organic light-emitting display panel according to claim 1, wherein:
at least one of the P-type host material in the first light-emitting material layer and the P-type host material in the second light-emitting material layer includes a carbazole-type group.

13. The organic light-emitting display panel according to claim 1, wherein:
at least one of the N-type host material in the first light-emitting material layer and the N-type host material in the second light-emitting material layer includes an aromatic ring group.

14. The organic light-emitting display panel according to claim 1, wherein:
a difference in the light-emitting wavelength between the first light-emitting material layer and the second light-emitting material layer is smaller than or equal to approximately 30 nm.

15. The organic light-emitting display panel according to claim 1, further comprising:
a first auxiliary functional layer sandwiched between the first electrode and the first light-emitting material layer,
wherein the first auxiliary functional layer includes the hole injection layer, the hole transport layer, the hole transport auxiliary layer, and an electron barrier layer.

16. The organic light-emitting display panel according to claim 1, further comprising:
a second auxiliary functional layer sandwiched between the second electrode and the second light-emitting material layer,
wherein the second auxiliary functional layer includes at least one of an electron injection layer, an electron transport layer, and a hole barrier layer.

17. An organic light-emitting display panel, comprising:
a substrate; and
a first electrode, a first light-emitting material layer, a second light-emitting material layer, and a second electrode disposed above the substrate in a preset order,
wherein:
the first light-emitting material layer includes at least one P-type host material and at least one N-type host material, and a total volume percentage content of the P-type host material is greater than a total volume percentage content of the N-type host material,
the second light-emitting material layer includes at least one P-type host material and at least one N-type host material, and a total volume percentage content of the N-type host material is greater than a total volume percentage content of the P-type host material,
the first light-emitting material layer and the second light-emitting material layer have different carrier transport capabilities, wherein the first light-emitting material layer is configured to transport holes and the second light-emitting material layer is configured to transport electrons for the electrons and the holes to be recombined to form excitons at an interface between the first light-emitting material layer and the second light-emitting material layer,
the first light-emitting material layer further includes at least one guest phosphorescent material, and the second light-emitting material layer further includes at least one guest phosphorescent material,
a total volume percentage content of the guest phosphorescent material in the first light-emitting material layer is greater than a total volume percentage content of the guest phosphorescent material in the second light-emitting material layer,
the guest phosphorescent material is selected not conducive to transport electrons,
a first auxiliary functional layer sandwiched between the first electrode and the first light-emitting material layer, wherein the first auxiliary functional layer includes at least one of a hole injection layer, a hole transport layer, and an electron barrier layer,
the total volume percentage content of the guest phosphorescent material in the first light-emitting material layer is greater than or equal to approximately 3%, and smaller than or equal to approximately 10%,
the total volume percentage content of the guest phosphorescent material in the second light-emitting material layer is greater than or equal to approximately 0.5%, and smaller than or equal to approximately 3%,
a thickness of the first light-emitting material layer is greater than a thickness of the second light-emitting material layer, and a thickness ratio of the first light-emitting material layer to the second light-emitting material layer is greater than 1, and smaller than or equal to 2, and the organic light-emitting display panel includes a plurality of light-emitting units corresponding to a red light-emitting color, a green light-emitting color, and a blue light-emitting color, respectively, and the hole injection layer, the hole transport layer, and the hole transport auxiliary layer together have a non-uniform total thickness, the non-uniform total thickness including:

a first total thickness corresponding to the blue light-emitting color, a second total thickness corresponding to the green light-emitting color, a third total thickness corresponding to the red light-emitting color, and the first total thickness is less than the second total thickness, and the second total thickness is less than the third total thickness, such that an effective cavity length of a microcavity structure between the first electrode and the second electrode is adjusted according to a light-emitting wavelength in each of the plurality of light-emitting units.

18. The organic light-emitting display panel according to claim 17, wherein:

the guest phosphorescent material in the first light-emitting material layer is the same as the guest phosphorescent material in the second light-emitting material layer, the P-type host material in the first light-emitting material layer is the same as the P-type host material in the second light-emitting material layer, and/or the N-type host material in the first light-emitting material layer is the same as the N-type host material in the second light-emitting material layer.

19. The organic light-emitting display panel according to claim 17, wherein:

in the first light-emitting material layer, a ratio of the total volume percentage content of the P-type host material to the total volume percentage content of the N-type host material is in a range of approximately [1, 9], and/or in the second light-emitting material layer, a ratio of the total volume percentage content of the P-type host material to the total volume percentage content of the N-type host material is in a range of approximately [1/9, 1].

20. The organic light-emitting display panel according to claim 17, wherein:

at least one of the P-type host material in the first light-emitting material layer and the P-type host material in the second light-emitting material layer includes a carbazole-type group, and/or at least one of the N-type host material in the first light-emitting material layer and the N-type host material in the second light-emitting material layer includes an aromatic ring group.

* * * * *